(12) United States Patent
Sanchez et al.

(10) Patent No.: US 11,711,411 B2
(45) Date of Patent: Jul. 25, 2023

(54) METHOD FOR TRANSPARENT ZERO-COPY DISTRIBUTION OF DATA TO DDS APPLICATIONS

(71) Applicant: Real-Time Innovations, Inc., Sunnyvale, CA (US)

(72) Inventors: Fernando Crespo Sanchez, San Jose, CA (US); Gerardo Pardo-Castellote, Santa Cruz, CA (US); Jan Van Bruaene, San Jose, CA (US); Tron Sjur Kindseth, San Francisco, CA (US); Harishkumar Umayi Kalyanaramudu, Santa Clara, CA (US)

(73) Assignee: Real-Time Innovations, Inc., Sunnyvale, CA (US)

( * ) Notice: Subject to any disclaimer, the term of this patent is extended or adjusted under 35 U.S.C. 154(b) by 534 days.

(21) Appl. No.: 16/827,332

(22) Filed: Mar. 23, 2020

(65) Prior Publication Data

US 2020/0314164 A1 Oct. 1, 2020

Related U.S. Application Data

(60) Provisional application No. 62/823,533, filed on Mar. 25, 2019.

(51) Int. Cl.
*H04L 65/65* (2022.01)
*H04L 67/12* (2022.01)
(Continued)

(52) U.S. Cl.
CPC .............. *H04L 65/65* (2022.05); *H03M 9/00* (2013.01); *H04L 25/14* (2013.01); *H04L 47/2416* (2013.01); *H04L 67/12* (2013.01)

(58) Field of Classification Search
CPC ...... H04L 65/65; H04L 47/2416; H04L 67/12
See application file for complete search history.

(56) References Cited

U.S. PATENT DOCUMENTS

| | | | |
|---|---|---|---|
| 7,533,128 B1* | 5/2009 | Sanchez | G06F 16/20 707/999.102 |
| 7,783,853 B1* | 8/2010 | Rhee | G06F 9/542 711/170 |

(Continued)

OTHER PUBLICATIONS

OMG Org, "Extensible and Dynamic Topic Types for DDS", http://www.omg.org/spec/DDS-XTypes/1.0, Version 1.0, pp. 77-79, 81, 87, 88, 123-125, 127 and 198 (Year: 2012).*

(Continued)

*Primary Examiner* — William G Trost, IV
*Assistant Examiner* — Adam A Cooney
(74) *Attorney, Agent, or Firm* — Lumen Patent Firm

(57) ABSTRACT

A method is provided for performing zero-copy distribution of data samples between applications running on the same node in a system using an Object Management Group (OMG) Data Distribution Service (DDS) and/or a Real-Time Publish Subscribe (RTPS) protocol. Further provided is a method for selecting the network representation to communicate with a DataReader in a system using an Object Management Group (OMG) Real-Time Publish Subscribe (RTPS) protocol. Still further provided is the combination of these two methods to communicate transparently using zero-copy within the same node and not using zero-copy for different nodes. Embodiments of this invention lead to a relatively small communication latency that is constant and independent of the data size for applications running within a single node.

27 Claims, 9 Drawing Sheets

(51) Int. Cl.
H04L 25/14 (2006.01)
H04L 47/2416 (2022.01)
H03M 9/00 (2006.01)

(56) References Cited

U.S. PATENT DOCUMENTS

| | | | |
|---|---|---|---|
| 8,671,135 B1* | 3/2014 | Joshi | H04L 41/0893 |
| | | | 455/410 |
| 2009/0271466 A1* | 10/2009 | Fields | G06F 9/54 |
| | | | 709/201 |
| 2011/0295923 A1* | 12/2011 | de Campos Ruiz | G06F 9/542 |
| | | | 709/201 |
| 2012/0246295 A1* | 9/2012 | Gonzalez-Banos | |
| | | | H04L 12/1822 |
| | | | 709/224 |
| 2013/0282853 A1* | 10/2013 | Jun | G06F 9/544 |
| | | | 709/213 |
| 2014/0365589 A1* | 12/2014 | Lee | H04L 12/1854 |
| | | | 709/206 |
| 2015/0370546 A1* | 12/2015 | Kim | G06F 8/35 |
| | | | 717/143 |

OTHER PUBLICATIONS

Jose M. Lopez-Vega, "A content-aware bridging service for publish/subscribe environments" Elsevier, The Journal of Systems and Software 86 (2013) pp. 108-124, (Year: 2012).*

* cited by examiner

METHOD FOR TRANSPARENT ZERO-COPY DISTRIBUTION OF DATA TO DDS APPLICATIONS

CROSS-REFERENCE TO RELATED APPLICATIONS

This application claims priority from U.S. Provisional Patent Application 62/823,533 filed Mar. 25, 2019, which is incorporated herein by reference.

FIELD OF THE INVENTION

This invention relates to Data Distribution Service (DDS) for Real-time Systems in which applications publish and receive data.

BACKGROUND OF THE INVENTION

Many Distributed systems employ a publish-subscribe data exchange in which applications publish data samples, which become available to remote applications interested in them.

Data Distribution Service (DDS) for Real-time Systems is a specification of a publish/subscribe middleware for distributed systems. As a networking middleware, DDS simplifies network programming. It implements a publish/subscribe model for sending and receiving data samples among software applications. The software applications create publishing and subscribing endpoints.

The publishing endpoints, called DataWriters, publish data samples for a Topic (e.g. image, temperature, location). The subscribing endpoints, called DataReaders, receive the data samples published by the DataWriters on a Topic. DataWriters and DataReaders are part of a DomainParticipant and they publish and receive data in a DDS domain, which is a logical network of DomainParticipants.

DDS takes care of delivering the data samples to all DataReaders that declare an interest in a Topic. Delivering a sample requires marshalling (serializing) the sample. Marshalling is the process of transforming the memory representation of a data sample to a serialized network representation suitable for transmission over the network.

In DDS, the memory representation of a data sample is determined by a language binding. The language binding specifies the programming-language mechanisms an application can use to construct and introspect data samples. For a given programming language there can be multiple language bindings.

In DDS, the serialized network representation of a data sample is called Extended Common Data Representation (CDR), and there are two versions: Extended CDR (encoding version 1) (XCDR1) and Extended CDR (encoding version 2) (XCDR2). The representations are defined in the OMG Extensible and Dynamic Topic Types for DDS (DDS-XTYPES) specification.

The network representation of a data sample always starts with a two-byte header representing the encapsulation identifier (EncapsulationId). The EncapsulationId encodes the following information:
  The network endianness, which determines the byte order for primitive values in the network buffer.
  The data representation version: XCDR1 or XCDR2.

In DDS, the network representation of a data sample is encapsulated in a Real-time Publish Subscribe Protocol (RTPS) message. RTPS is the network protocol for DDS applications.

Each publishing or subscribing endpoint (DataWriter or DataReader) is associated with a type that defines the structure for all data samples sent by the DataWriter or received by the DataReader. Types can be described in multiple languages including XML (eXtensible Markup Language) and IDL (Interface Definition Language). For example, the following IDL snippet defines a type for a camera image topic called CameraImage. This type is a structure type that contains members that themselves have a type:

```
const long IMAGE_SIZE = 1024 * 1024;
struct CameraImage {
    @key long camera_id;
    octet image_data[IMAGE_SIZE];
};
```

Types and members of types can be marked with annotations. Annotations can be used to add additional behavior and capabilities to a DDS Type. For example:

```
const long IMAGE_SIZE = 1024 * 1024;
@mutable
struct CameraImage {
    @key long camera_id;
    octet image_data[IMAGE_SIZE];
};
```

The @mutable annotation on the camera image type allows the type to evolve by adding or removing members. This annotation determines the way in which a data sample for the type is serialized.

DDS systems use a discovery process to establish communication between DDS Entities (DomainParticipants, DataReaders and DataWriters). This discovery process, among other things, is used to exchange DDS locators, which are transport addresses where data samples should be sent. A locator contains:
1. The transport type. The transport type indicates the type of transport, such as UDPv4 or UDPv6.
2. The transport address. The format of the transport address is transport specific, and it identifies the receiving application or receiving node. For example, for a UDPv4 transport, the address is an IPv4 address.
3. The transport port number. The port number is transport specific and it is used to distinguish between different DomainParticipants, DataReaders and DataWriters sharing the same transport address.

The discovery process makes applications location independent. In a DDS system, applications can run co-located in a single node or can be distributed across different nodes.

A standard DDS application typically makes at least four copies in the process of distributing a data sample from the publishing application to the subscribing application (including the serialization and deserialization). For small data samples the overhead of converting from the memory representation to the network representation may be negligible, but for systems that distribute large data samples such as radar images the CPU overhead to marshal data as well as the high memory load due to the number of copies of data may cause application failures or non-deterministic behavior.

FIG. 1 shows the copies that a middleware would make to send and receive a data sample over two possible transports: UDP and shared memory.

Copy 1: serialization into a network buffer.
Copy 2: reception.
Copy 3: reassembly.
Copy 4: deserialization into the application object, according to its native memory representation.

The number of copies becomes an important source of high latency and memory usage in applications that send and receive very large data samples. Therefore, reducing the number of copies made by the middleware or network infrastructure when publishing and receiving large samples becomes critical.

Eliminating these copies when publishing data samples to applications within the same node is the focus of this invention.

SUMMARY OF THE INVENTION

Definitions

Node: Any physical device within a network that's able to send, receive, or forward information.
Node identifier: A 16-byte identifier that identifies a node.
DataWriter: An entity that publishes data samples.
DataReader: An entity that receives data samples.
Network representation: Represents how a sample is transmitted on the network. In DDS, the serialized network representation of a data sample is called Extended Common Data Representation (CDR), and there are two versions: Extended CDR (encoding version 1) (XCDR1) and Extended CDR (encoding version 2) (XCDR2). The representations are defined in the OMG Extensible and Dynamic Topic Types for DDS (DDS-XTYPES) specification.
Memory representation: Represents how a data sample is layout in memory and it is determined by the language binding.
Language binding: specifies the programming-language mechanisms an application can use to construct and introspect data samples. For a given programming language there can be multiple language bindings.
Plain language binding: The native language binding for a programming language.
Plain memory representation: The memory representation for the plain language binding.
Locator: Transport address where the network representation of a data sample should be sent.
Shared memory locator: A locator referring to a shared memory transport address.

One of the key concepts of this invention is that when a DataWriter and a DataReader run on the same node, the DataWriter can send to the DataReader a reference to a data sample as opposed to the full content of the sample. Because the memory representation of the data sample is on the same node, the DataReader can use the reference to locate the memory representation of the data sample. FIG. 2 shows the way in which data samples are sent from a DataWriter to a DataReader in a standard DDS system. FIG. 3 shows the way in which data samples are sent from a DataWriter to a DataReader using a reference as described herein for this invention.

Another key concept of this invention is that the zero-copy transmission must be transparent (FIG. 4). This means that the application containing the DataWriter does not need to know which applications containing DataReaders are co-located on the same node to take advantage of the zero-copy transfer. The DataWriter transparently uses the zero-copy distribution if possible and otherwise falls back to the standard distribution methods.

In one embodiment, the invention is a method for performing zero-copy distribution of data samples between applications running on the same node in a system using an Object Management Group (OMG) Data Distribution Service (DDS) and/or a Real-Time Publish Subscribe (RTPS) protocol.

In another embodiment, the invention is method for selecting the network representation to communicate with a DataReader in a system using an Object Management Group (OMG) Real-Time Publish Subscribe (RTPS) protocol.

In still another embodiment, the invention is the combination of these two methods to communicate transparently using zero-copy within the same node and not using zero-copy for different nodes.

The embodiments of this invention lead to a relatively small communication latency that is constant and independent of the data size for applications running within a single node.

DETAILED DESCRIPTION

Transparent Zero-Copy Delivery of Data to DDS Applications

To address the CPU and memory issues resulting from doing multiple copies of a data sample, this invention provides a method and system for transparent zero-copy distribution of data samples between co-located applications (applications running on the same node).

Zero-copy means that data samples are not copied by the middleware. Transparent means that an application does not need to know which applications are co-located to take advantage of the optimized transfer, since the middleware transparently uses the zero-copy distribution if possible and otherwise falls back to the standard distribution methods.

Figure 5:
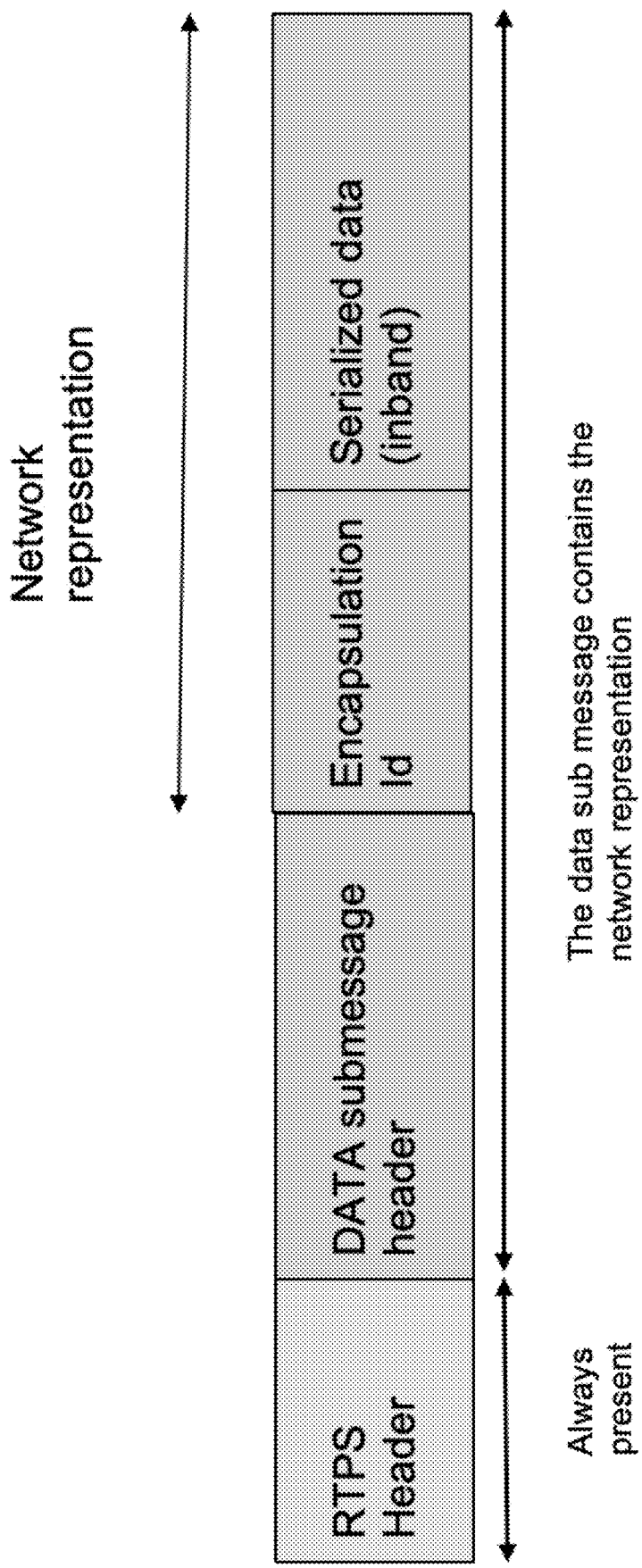
FIG. 5 shows according to an exemplary embodiment of the invention a DATA RTPS Submessage.

DDS applications use the Real-Time Publish-Subscribe (RTPS) protocol to exchange data. The RTPS specification describes how data samples are transmitted across the network. A DataWriter marshals the data to a network representation that is then encapsulated in an RTPS message with the structure as shown in FIG. 5.

An RTPS message always starts with a header followed by one or more submessage. The DATA submessage (FIG.

2) is used to transfer data samples. It should be noted that RTPS includes two types of data submessages: DATA and DATA_FRAG. This document will always use the DATA submessage for simplicity. All concepts also apply to DATA_FRAG. The DATA sub-message has the following layout.
1. DATA submessage header: The submessage header includes information such as the data sample sequence number and other metadata known as inline Qos.
2. EncapsulationId: The EncapsulationId indicates the network representation of the data sample(s) that follow. The EncapsulationId is used by the DataReaders to convert the serialized data samples back to the memory representation (e.g. C++ structure).
3. Serialized data: The serialized data consists of the data samples in a serialized format that matches the EncapsulationId.

A key concept of this invention is the concept of a shared memory reference as the network representation of a data sample.

The standard DDS EncapsulationIds require the serialized data samples to be part of the DATA submessage. This invention introduces a new type of EncapsulationId, a data reference encapsulation. The data that follows, a reference encapsulation, is not the serialized data sample itself, but instead a description of how to retrieve the data sample out-of-band.

A particular type of reference encapsulation is the shared memory reference encapsulation distributed to DDS applications within the same nodes to achieve zero-copy distribution of data. This reference is used by DataReaders to locate data samples in a shared memory segment. For more information on the new shared memory reference encapsulation, see infra The Shared Memory Reference Network Representation.

How to Select Zero-Copy Distribution for a Type

This invention introduces a new annotation, transfer_mode, as a way to indicate that samples from the annotated type can benefit from zero-copy delivery for applications running on the same node. The following values are supported:
INBAND: This transfer method is the standard inband transfer where data samples are serialized.
SHMEM_REF: This transfer method indicates that the middleware shall, if possible, transfer data samples by sending a reference to an address in a shared memory segment (shared memory reference).

For example, to enable the zero-copy transfer mode over shared memory for the CameraImage, use the following IDL:

```
@transfer_mode(SHMEM_REF)
struct CameraImage {
    long camera_id; //@key
    octet image_data[IMAGE_SIZE];
};
```

Other transfer mode values are also possible. This would allow using additional out-of-band mechanisms to transfer the content of a data sample. For example:
A FTP (File Transfer Protocol) transfer mode where a reference encapsulates a FTP url to a file containing the data sample.
A DMA (Direct Memory Access) transfer mode where a reference encapsulates the DMA address of the data sample.

Data Samples Memory Management

Standard DDS applications typically allocate data samples on the heap, populate them, and then pass them to a DataWriter for distribution by invoking the DataWriter::write( ) operation. Because a DataWriter makes a copy of a data sample when the sample is serialized, the application is free to use the sample memory again after writing the sample, without interfering with the distribution process.

Consider the following IDL type:

```
struct CameraImage {
    @key long camera_id;
    octet image_data[IMAGE_SIZE];
};
```

A standard DDS application has methods to allocate a data sample before it is populated and sent. The following sequence is common:

```
CameraImage *image = NULL;
/* Allocate memory from heap */
image = CameraImage::create_data( )
/* Fill in data */
image->image_data = ...
/* The middleware distributes the data */
ImageDataWriter->write(image);
```

Figure 1:
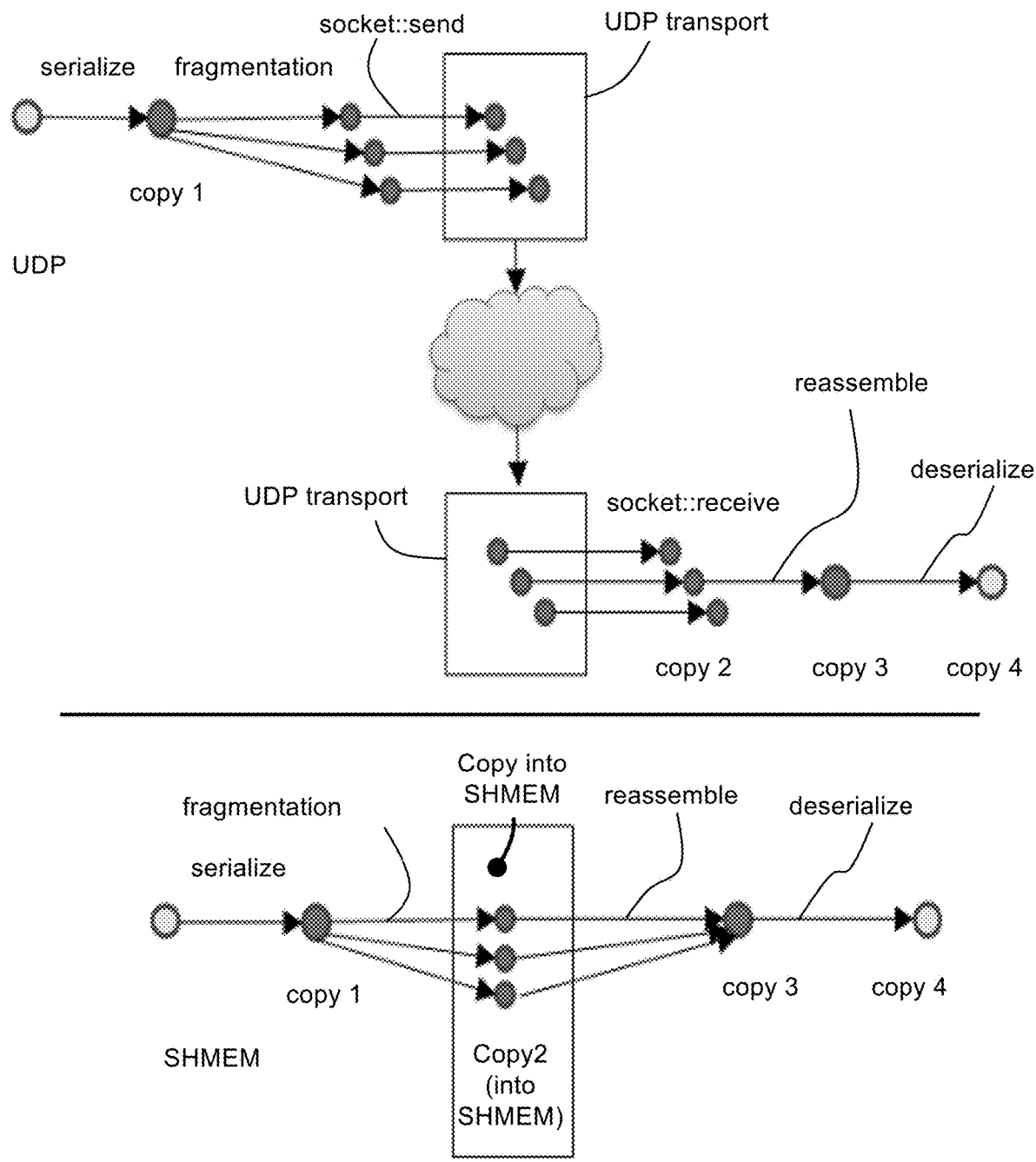
FIG. 1 shows according to an exemplary embodiment of the invention a number of copies in normal DDS system.
Figure 2:
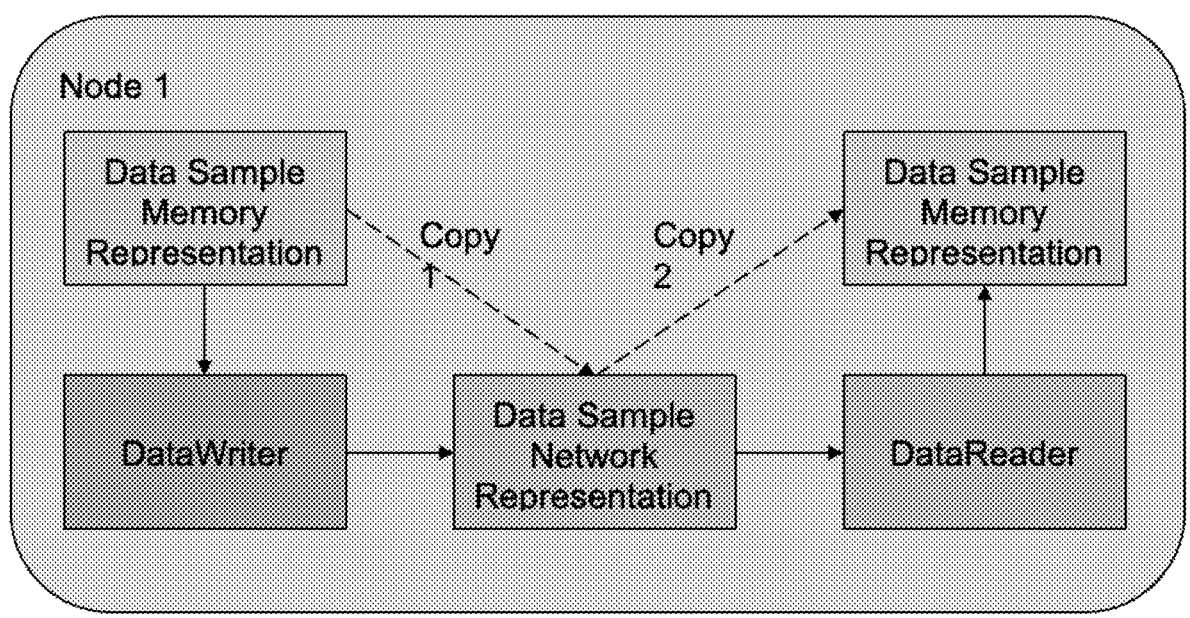
FIG. 2 shows according to an exemplary embodiment of the invention a standard DDS Data Sample Transmission within the Same Node.
Figure 3:
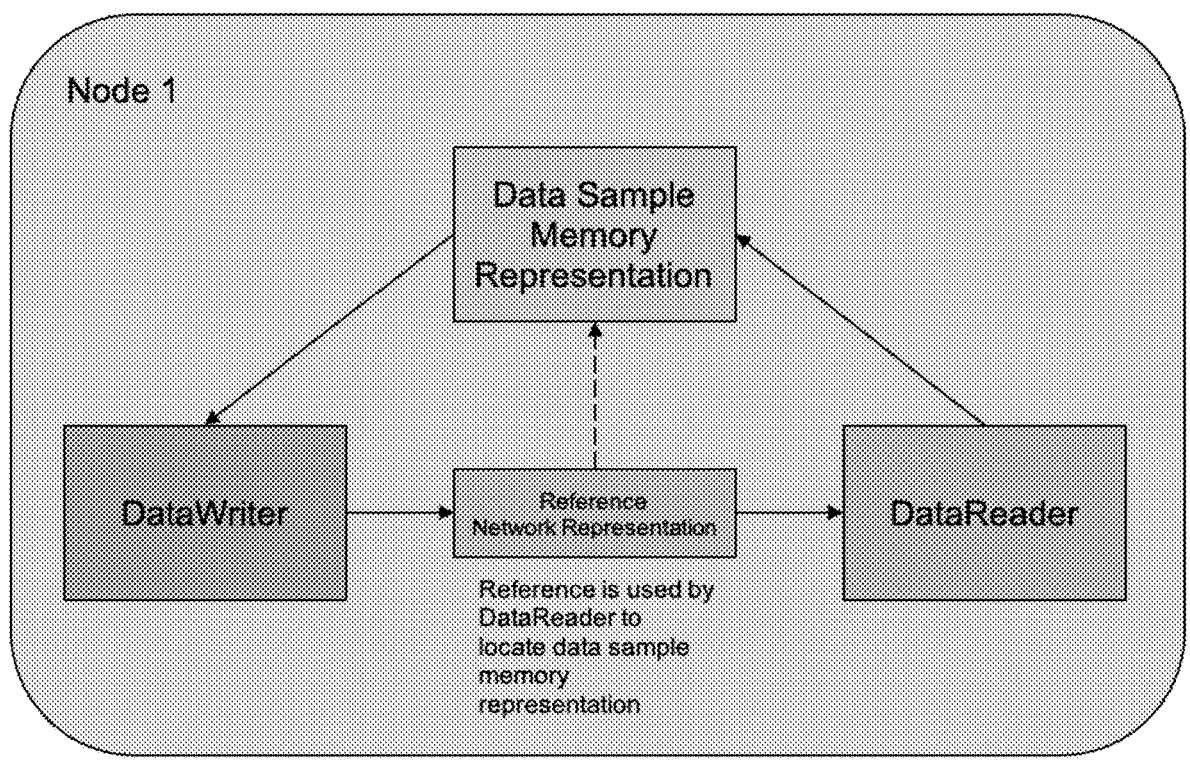
FIG. 3 shows according to an exemplary embodiment of the invention a zero-copy DDS Data Sample Transmission within the Same Node.
Figure 4:
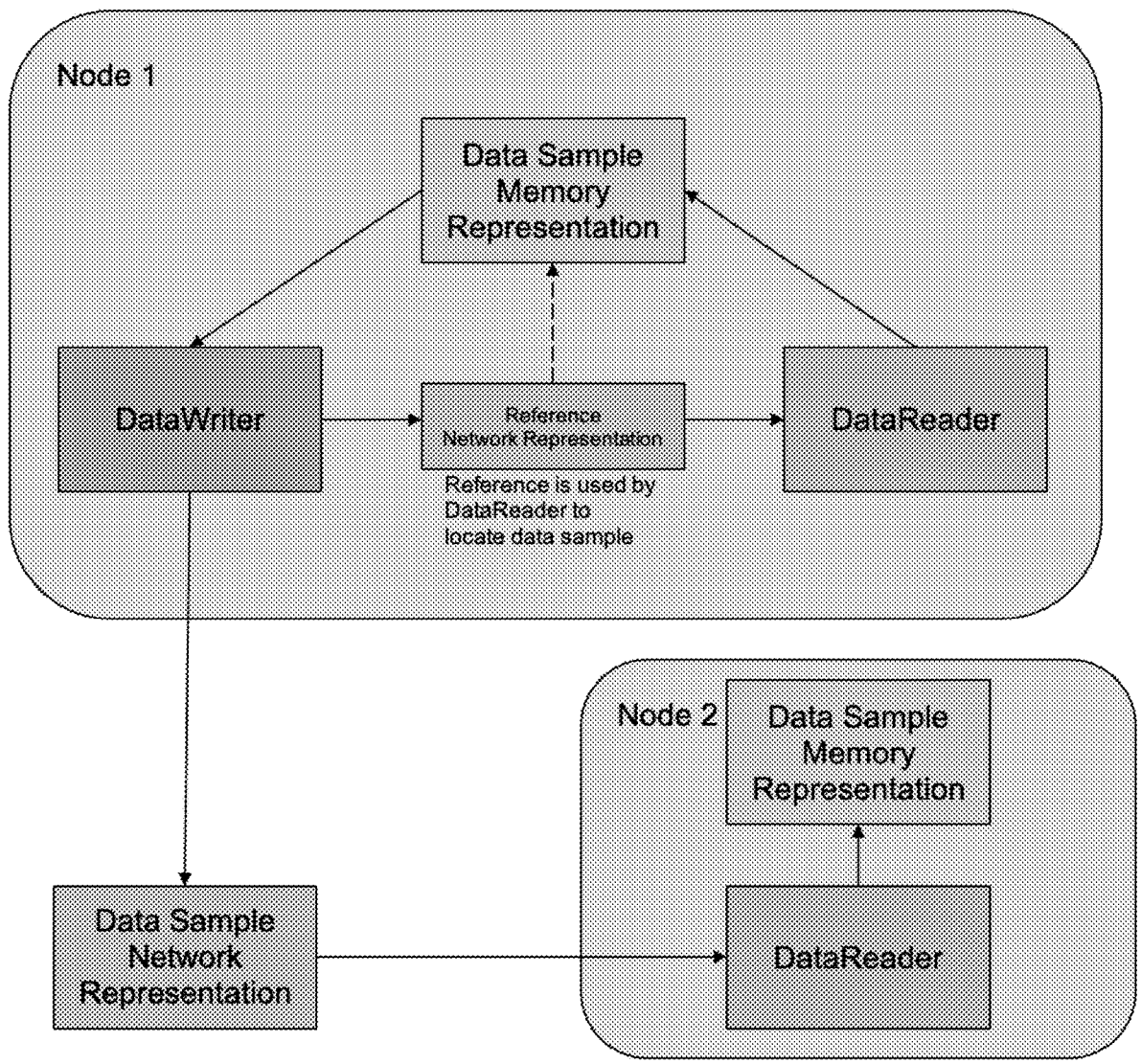
FIG. 4 shows according to an exemplary embodiment of the invention Transparent DDS Data Sample Transmission.

As shown in FIG. 1, because the middleware makes a copy of the data sample, the image can be reused after calling DataWriter::write( ) as illustrated below.

```
CameraImage *image = NULL;
/* Allocate memory from heap */
image = CameraImage::create_data( )
While (1)
{
    /* Fill in data */
    image->image_data = ...
    /* The middleware distributes the data */
    imageDataWriter->write(image);
    ...
}
```

When a sample is allocated from the heap, the application owns the sample memory and the middleware owns the network representation.

Allocating Data Samples from Shared Memory

To achieve zero-copy data distribution, the application can no longer allocate data samples from the heap. Instead, the data samples are stored in one or more shared memory segments owned by the DataWriter.

When a type is marked with @transfer_mode(SHMEM_REF), a DataWriter for that type creates a one or more shared memory segments that will be used to contain the Camera Image data samples. When data samples are allocated in shared memory, different applications can map the shared memory segments into their local address space and directly access the data samples as shown in FIG. 6.

Figure 6:
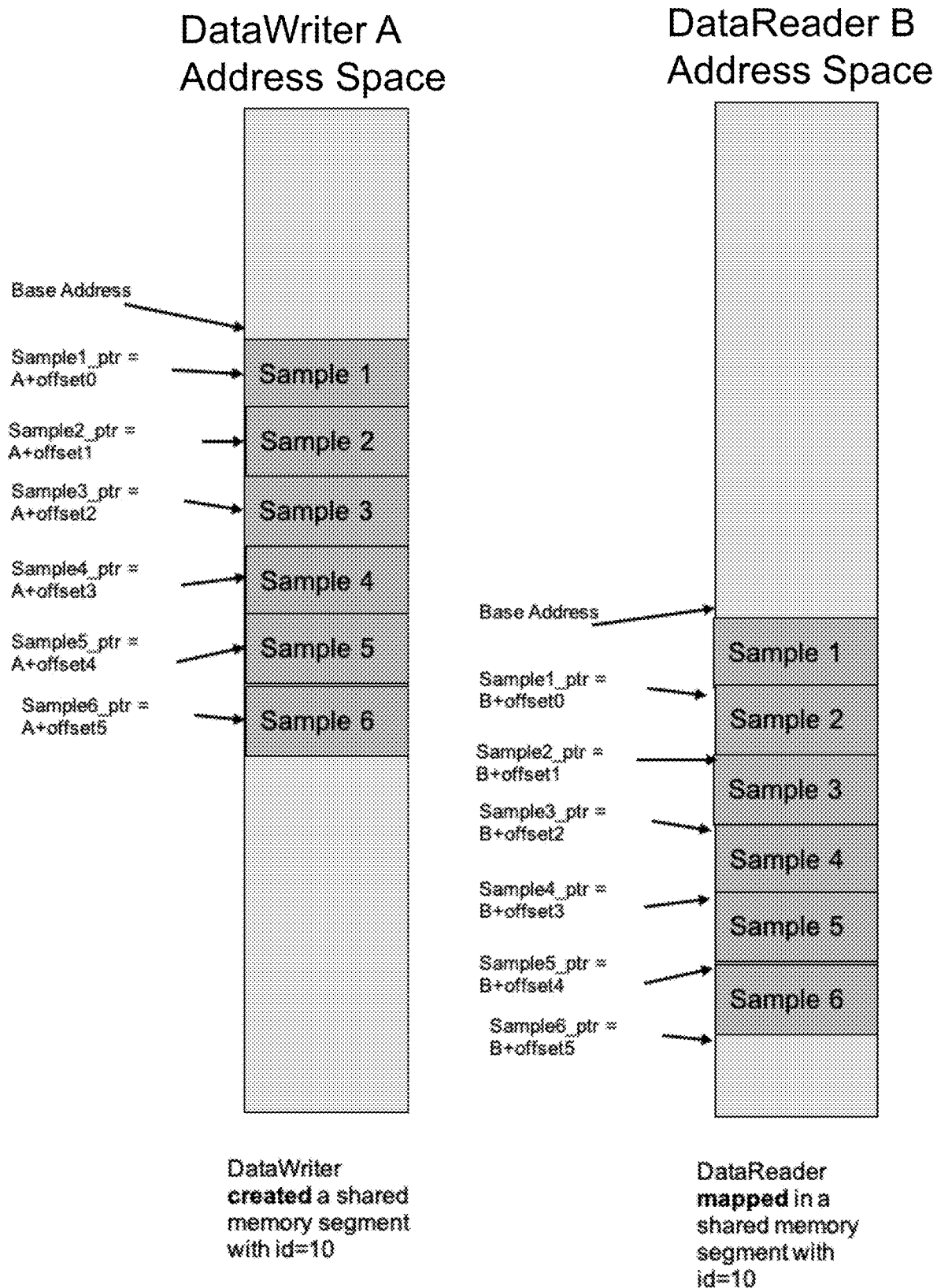
FIG. 6 shows according to an exemplary embodiment of the invention a Mapping of a Shared Memory Segment.

FIG. 6 shows how a DataWriter has allocated a set of samples in a shared memory segment with id=10 and how a DataReader has mapped the segment into its local memory space. Sample1_ptr in DataWriter A's address space points to the same physical memory as Sample1_ptr in DataReader B's address space.

A DataWriter provides to the application a way to loan data samples from the shared memory segment. After a data sample is loaned, the application can populate it and write it.

This invention introduces two new APIs for this purpose, using the following IDL type as an example:

```
@transfer_mode(SHMEM_REF)
struct CameraImage {
    long camera_id; //@key
    octet image_data[IMAGE_SIZE];
};
```

The following two APIs are available:
CameraImageDataWriter::get_loan( )

This API loans (borrows) a data sample to the application. While an application has a loan on the data sample, a DataWriter cannot use the data sample or return it in a different call to get_loan. The application maintains the loan of the data sample until it either calls CameraImageData-Writer::write( ) or explicitly returns the loan by calling the new API CameraImageDataWriter::discard_loan( ).

Once a sample is written, the DataWriter takes responsibility for returning the sample back to the shared memory segment after the sample is delivered and acknowledged by the matching DataReaders.
CameraImageDataWriter::discard_loan( )

Figure 7:
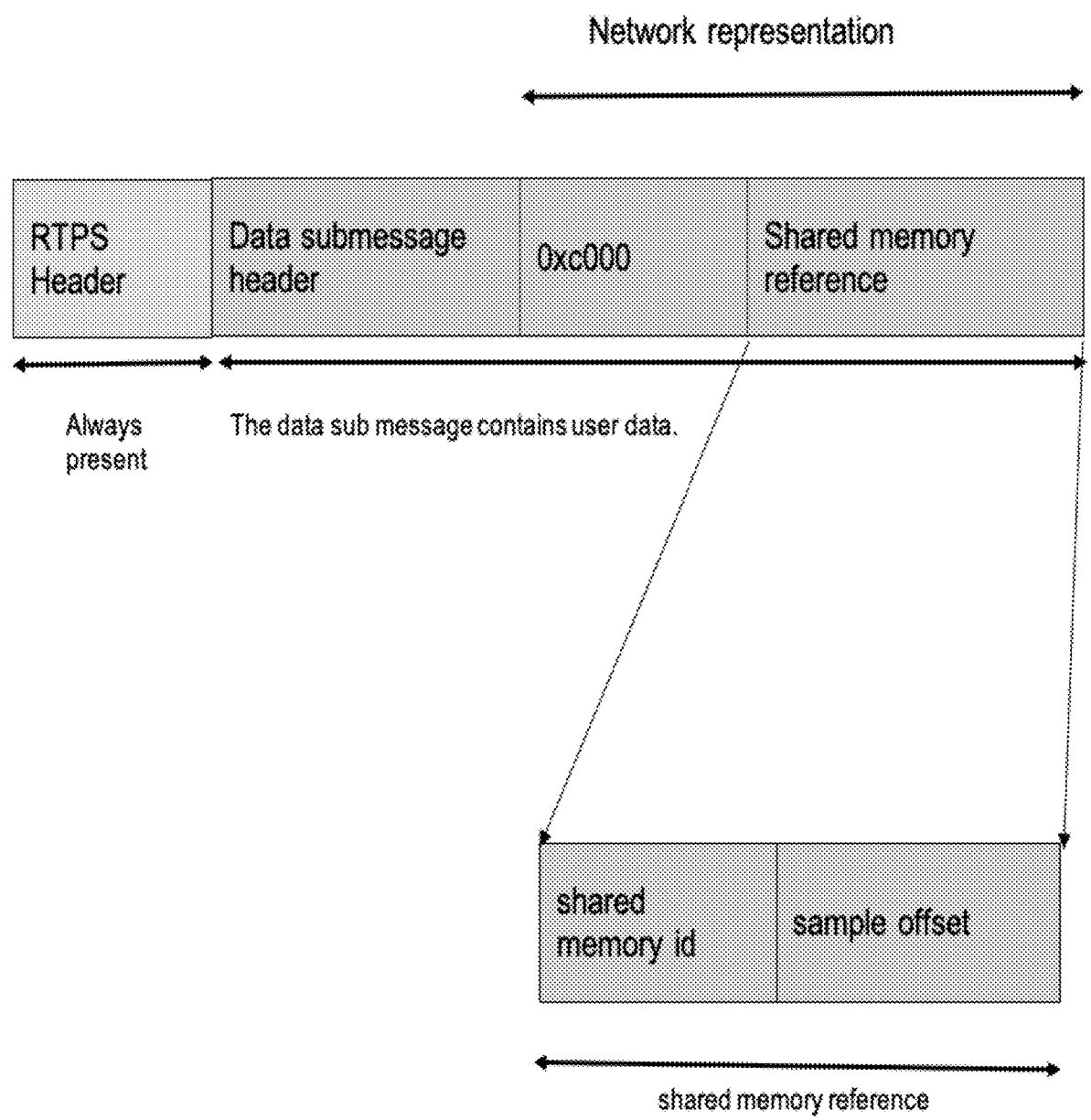
FIG. 7 shows according to an exemplary embodiment of the invention a Shared Memory Reference.

This API discards a loan on a DDS data sample previously loaned with a call to CameraImageDataWriter::get_loan( ). Discarding a loan means the DDS application indicates it no longer needs access to the data sample.
Format of a Data Sample Each one of the data samples in shared memory is preceded by a header that contains metadata about the sample. The header contains the following information:
   State: Indicates if a sample can be loaned to the application.
   Shared Memory Id and Sample Offset: Identify the sample in the shared memory reference sent as part of the RTPS DATA message. See section The Shared Memory Reference Network Representation.
   Epoch: This field is used to check data consistency. See section Detecting an Inconsistent Data Sample in the Receiving Application.
The Shared Memory Reference Network Representation With zero-copy delivery, a DataWriter does not send the serialized sample to a DataReader, but a shared memory reference to the data sample in memory. This invention introduces a new EncapsulationId sent as part of the RTPS DATA sub-message that a DataWriter uses to publish a reference to a DDS data sample in shared memory: SHM-REF_PLAIN (0xc000). This encapsulation indicates that the data sample is in shared memory with a plain language binding (e.g. C++ structure).
Other EncapsulationIds are Possible for Different Language Bindings The address to a data sample returned by calling CameraImageDataWriter:get_loan( ) is in the local address space of the DataWriter. However, a DataWriter does not know what the corresponding address will be in a matching DataReader's address space, because the OS may map the shared memory region to a different address space. Thus, a shared memory reference EncapsulationId cannot contain absolute addresses, but rather must provide sufficient information for a DataReader to determine the corresponding local address after the shared memory segment owned by the DataWriter is mapped into the DataReader memory space. The shared memory reference has the layout shown in FIG. 7.

When a DataReader receives the reference, it uses the following steps to get an address in its local address space:
1. Attaches to the shared memory segment identified by the shared memory id.
2. Stores the base address of the mapped shared memory region in local memory.
3. Adds sample offset to the base address to obtain the absolute data sample local address.

The Memory Representation of a Sample for Out-of-Band Transfer Modes

The memory representation of the samples that will be used for out-of-band transfer (e.g. shared memory data sample) cannot contain memory addresses (e.g. pointers in C++). However, they may contain offsets to the beginning or some other location in the sample. The offsets can be mapped by the DataReader using the Language Binding APIs to the local addresses of the members.
The Locator and Network Representation Selection Process To communicate with a DataReader, a DataWriter must choose first the locator to which to send the data samples and second the network representation used for the samples.

DataReaders can be reachable on multiple locators that are announced as part of the DDS discovery process.

In standard DDS, there is no way to indicate what network representation is preferred on a locator. The standard only allows a global selection of the network representation across all locators. If a DDS system contains applications running on the same node and on different nodes at the same time, with a global selection of the network representation, the DataWriters could not simultaneously support zero-copy transfer over shared memory using SHMREF_PLAIN EncapsulationId and publish data samples across the network using XCDR1 or XCDR2 EncapsulationIds.

Figure 8:
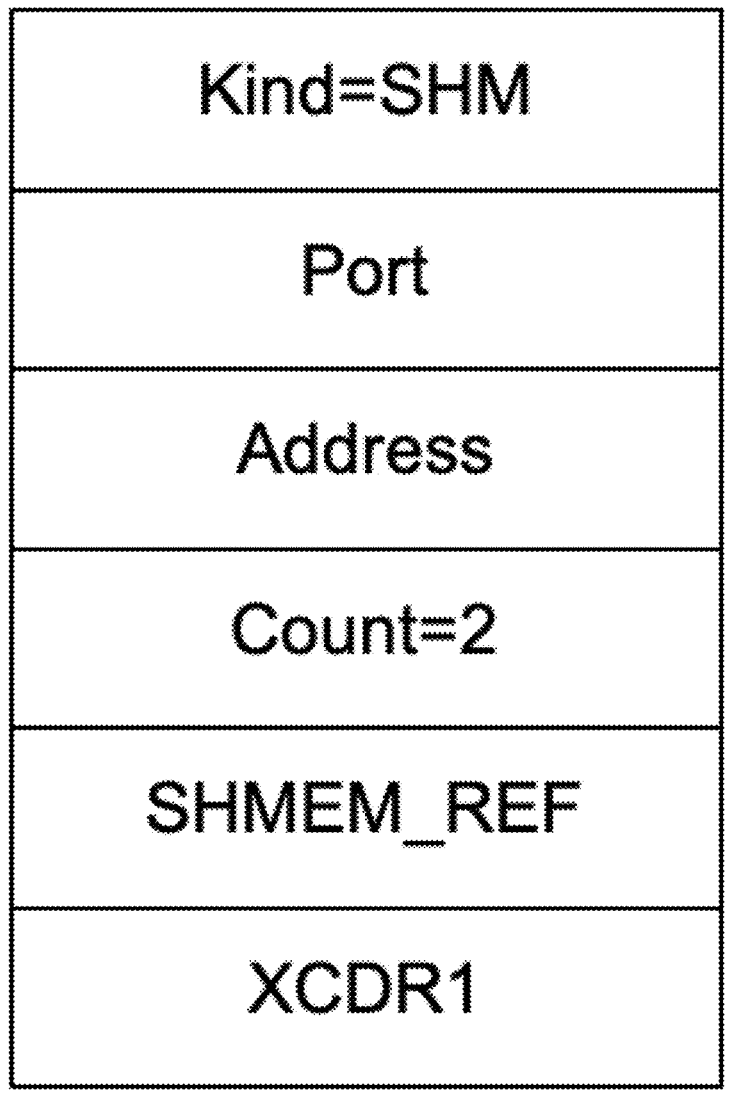
FIG. 8 shows according to an exemplary embodiment of the invention a Shared Memory Locator.

To solve this problem, this invention adds additional information to a locator 'LA' to allow a DataReader to request a set of encapsulations for the locator 'LA'. A DataWriter uses this list to determine the best encapsulation to publish data samples to the DataReader on 'LA'. The additional information for a locator is a list of preferred encapsulations in order of priority. For example, the locator for a shared memory transport may look as shown in FIG. 8.

This locator informs a DataWriter that the DataReader prefers shared memory references over the standard inband XCDR1 encapsulation.

To select SHMEM_REF as the network representation, the DataWriter must determine that the DataReader is co-located within the same node. This invention uses the information in the DataReader locator to make this decision; it only selects SHMEM_REF as the network representation when requested as part of a locator from which the DataWriter can infer that the DataReader is running on the same node.

For a shared memory transport locator, the DataWriter can determine if the DataReader is on the same node as follows:
1. The DataWriter tries to attach to the shared memory segment identified by the shared memory id specified in the locator port. If it does not succeed, the DataWriter knows that the DataReader is on a different node and it will not send data samples to the DataReader on this locator.
2. If attaching to the shared memory segment succeeds, the DataWriter compares a sixteen-byte identifier in the header of the shared memory segment created by the shared memory transport with a sixteen-byte identifier received in the shared memory locator transport address. If these two values are different, the DataWriter knows that the DataReader is not on the same node and it will not send data samples to the DataReader on this locator.
3. Otherwise, the DataReader and DataWriter are co-located and the DataWriter can publish data samples using SHMEM_REF encapsulations to the DataReader.

Detecting an Inconsistent Data Sample in the Receiving Application

Zero-copy transfer over shared memory makes no copies of the published data samples. The data samples processed by a DataReader reside in a shared memory segment created by the DataWriter.

The DataWriter can decide to reuse a data sample as soon as the DataReader acknowledges the reception of the sample, but before the DataReader's application processes the sample. Reusing a sample means that the DataWriter can make it available to the DataWriter's application via the new DataWriter:get_loan( ) operation and the application may overwrite the sample contents.

This invention adds a new API to the DataReader API that an application can use to determine if the data sample has been modified before the application is done processing the sample:

```
DDS_ReturnCode_t FooDataReader::is_data_consistent(
    DDS_Boolean &is_data_consistent,
    const Foo &sample,
    const DDS_SampleInfo &sample_info);
```

To support the implementation of this method, this invention sends an EPOCH value as part of the inline Qos of the RTPS DATA submessage containing the reference to the shared memory sample. The EPOCH value is increased each time the application gets a loan on a data sample from the DataWriter and is stored in a header associated with the data sample in shared memory. In addition, the EPOCH is sent when a loaned data sample is published using the new inline Qos parameter.

When an application calls DataReader::is_data_consistent( ), the implementation compares the value of the EPOCH received on the wire in the RTPS DATA submessage with the value of the EPOCH contained in the shared memory segment for the sample. If they are different, the output value is_data_consistent is set to false.

Performance

Figure 9:
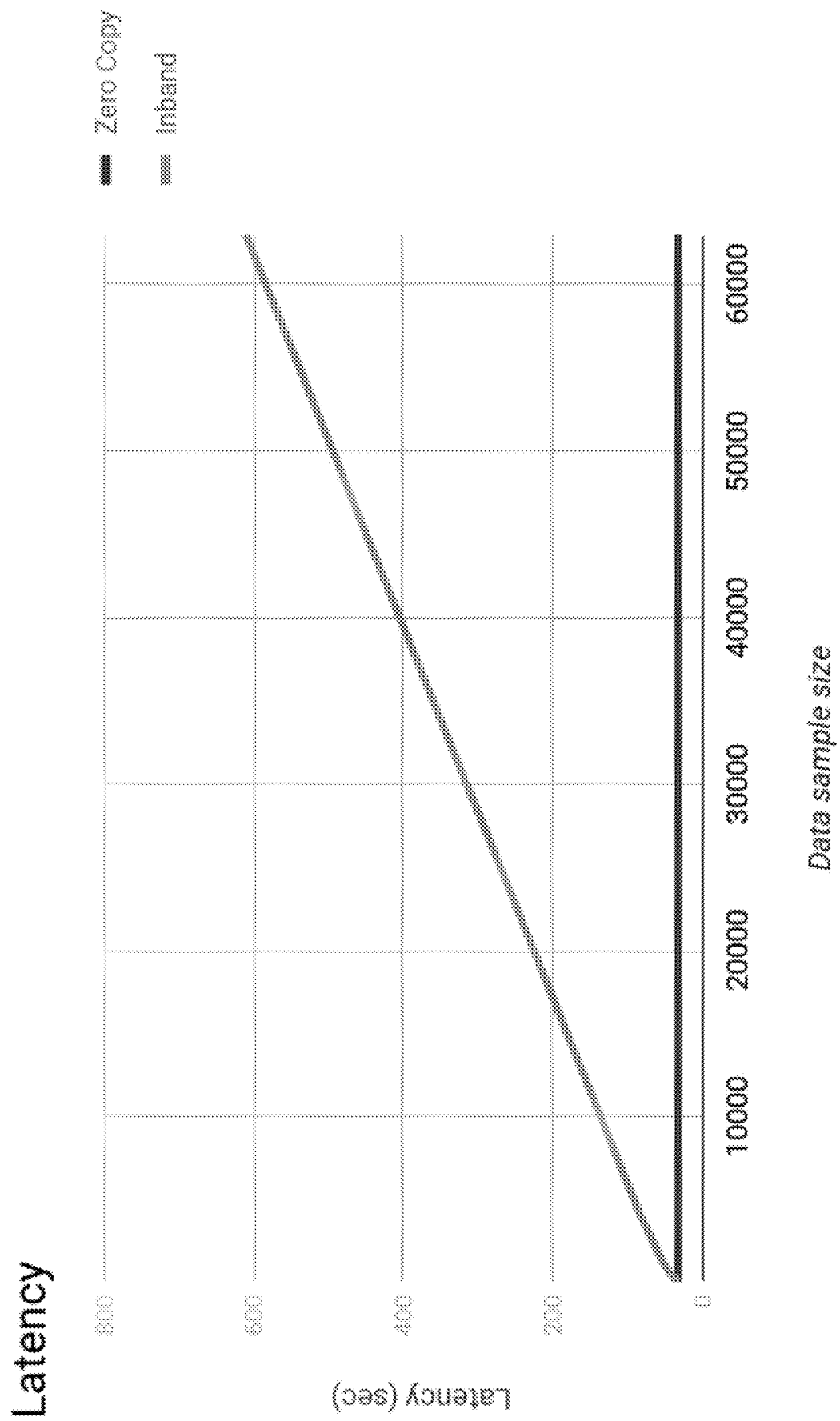
FIG. 9 shows according to an exemplary embodiment of the invention a zero-copy Distribution Performance.

The latency with zero-copy delivery is independent of the sample size, making the capability highly scalable. FIG. 9 shows a comparison for transmission latency between a zero-copy transfer using the SHMEM_REF network representation of a data sample and an inband transfer using the standard inband XCDR1 network representation of a data sample as the serialized contents of an RTPS DATA submessage.

Embodiments of this invention can be in the form of a method, system, computer-implemented method executable by computer hardware, computer code where methods steps are executable by a computer processor, distributed over the Internet where the system or method steps are executed by a computer server, or the like.

What is claimed is:
1. A method for performing zero-copy distribution of data samples between applications running on the same node in a system using an Object Management Group (OMG) Data Distribution Service (DDS), a Real-Time Publish Subscribe (RTPS) protocol or a combination thereof, comprising:
   (a) having a node;
   (b) having a pool of data samples in a shared memory segment;
   (c) having a first application publishing the data samples from the pool with a DataWriter;
   (d) having a second application receiving the data samples from the pool with a DataReader;
   (e) having a memory representation of the data samples;
   (f) having a network representation of the data samples that is a reference;
   (g) the DataWriter sending references of the data samples to the DataReader; and
   (h) the DataReader using the references to access the memory representation of the data samples wherein there is zero-copying between (i) the first application publishing the samples and (ii) the second application receiving the samples.

2. The method as set forth in claim 1, wherein the memory representation is memory position independent.

3. The method as set forth in claim 1, wherein the memory representation is an Extended CDR encoding version 1 (XCDR1) or an Extended CDR encoding version 2 (XCDR2).

4. The method as set forth in claim 1, wherein the memory representation is a C/C++ plain memory representation for fixed-size DDS types.

5. The method as set forth in claim 1, wherein the memory representation uses offsets instead of memory addresses.

6. The method as set forth in claim 1, wherein the DataWriter sends to the DataReader an RTPS DATA message containing a shared memory ID, a shared memory offset, and an epoch value.

7. The method as set forth in claim 6, wherein the shared memory ID and the shared memory offset identify a data sample in a shared memory segment.

8. The method as set forth in claim 6, wherein the shared memory ID and the shared memory offset are included as part of the reference.

9. The method as set forth in claim 6, wherein the epoch value identifies the content of the data sample.

10. The method as set forth in claim 6, wherein the epoch value is included as part of an inline QoS of the RTPS DATA.

11. The method as set forth in claim 1, wherein the shared memory pool is created by the DataWriter.

12. The method as set forth in claim 1, wherein the first application borrows data samples from the pool and writes the borrowed data samples with the DataWriter.

13. The method as set forth in claim 1, wherein the data sample from the pool has a header including a state and an epoch value.

14. The method as set forth in claim 13, wherein the state indicates whether the sample can be borrowed by the first application.

15. The method as set forth in claim 13, wherein the epoch value increases every time the first application borrows the sample from the pool.

16. The method as set forth in claim 1, wherein the DataWriter sets the state of a data sample header to indicate that the data sample cannot be borrowed by the first application prior to sending the data sample to the DataReader.

17. The method as set forth in claim 1, wherein the DataWriter sets the state of a data sample header to indicate that the data sample can be borrowed by the first application after the DataReader has acknowledged the data sample.

18. The method as set forth in claim 1, wherein the DataReader uses a shared memory ID and a shared memory offset in the RTPS DATA to access the data sample in a shared memory segment.

19. The method as set forth in claim 1, wherein the DataReader compares an epoch value in the RTPS DATA with an epoch in a data sample header to check that the content of a data sample has not been modified.

20. A method for selecting the network representation to communicate with a DataReader in a system using an Object Management Group (OMG) Real-Time Publish Subscribe (RTPS) protocol, comprising:
(a) having a DataWriter running on a first node;
(b) having a DataReader running on a second node;
(c) having a locator in which the DataReader is reachable;
(d) having multiple network representations;
(e) having each network representation identified by an encapsulation identifier;
(f) the DataReader assigning a list of encapsulation identifiers to the locator ordered by priority, wherein the shared memory reference network representation has the highest priority; and
(g) the DataWriter selecting the highest priority network representations in the list that is compatible between the DataWriter and DataReader, wherein the network representation is a shared memory reference for zero-copy distribution from the DataWriter to the DataReader in case the second node and the first node are the same nodes.

21. The method as set forth in claim 20, wherein the network representations are an Extended CDR encoding version 1 (XCDR1), an Extended CDR encoding version 2 (XCDR2), or a shared memory reference.

22. The method as set forth in claim 20, wherein the DataReader creates a shared memory segment associated with a shared memory locator.

23. The method as set forth in claim 20, wherein a shared memory locator contains a shared memory ID that can be used to attach to a shared memory segment created by the DataReader and a node identifier that can be used to identify the second node.

24. The method as set forth in claim 20, wherein the DataReader writes a node identifier in the shared memory segment.

25. The method as set forth in claim 20, wherein the DataWriter uses the shared memory ID in a locator to attach to a shared memory segment created by the DataReader.

26. The method as set forth in claim 20, wherein the DataWriter compares a node identifier in a shared memory locator with a node identifier in a shared memory segment to determine whether the first node and the second node are the same.

27. A method for performing transparent zero-copy distribution for a DataWriter and a DataReader running on the same node and a non zero-copy distribution for DataWriter and a DataReader running on different nodes, comprising the combination of the method of claim 1 or the method of claim 20.

* * * * *